United States Patent [19]

Latz

[11] Patent Number: 5,556,520
[45] Date of Patent: Sep. 17, 1996

[54] METHOD FOR CONTROLLING A REACTIVE SPUTTERING PROCESS

[75] Inventor: Rudolf Latz, Rodgau, Germany

[73] Assignee: Leybold Aktiengesellschaft, Hanau, Germany

[21] Appl. No.: 436,651

[22] Filed: May 8, 1995

Related U.S. Application Data

[63] Continuation of Ser. No. 989,700, Dec. 14, 1992, abandoned, which is a continuation of Ser. No. 692,925, Apr. 29, 1991, abandoned.

[30] Foreign Application Priority Data

Mar. 1, 1991 [DE] Germany ............................. 41 06 513.1

[51] Int. Cl.$^6$ ..................................................... C23C 14/34
[52] U.S. Cl. ............................... 204/192.13; 204/192.23; 204/298.03; 204/298.07; 204/298.08
[58] Field of Search ..................... 204/192.12, 192.13, 204/298.08, 298.03, 298.07, 192.22, 192.23

[56] References Cited

U.S. PATENT DOCUMENTS

| | | | |
|---|---|---|---|
| 4,124,474 | 11/1978 | Bomchil et al. | 204/192 R |
| 4,201,645 | 5/1980 | Riegert | 204/192 R |
| 4,283,260 | 8/1981 | Thomas et al. | 204/192 R |
| 4,500,408 | 2/1985 | Boys et al. | 204/298 |
| 5,108,569 | 4/1992 | Gilboa et al. | 204/298.08 X |

FOREIGN PATENT DOCUMENTS

| | | |
|---|---|---|
| 2417288 | 8/1975 | Germany . |
| 2750611 | 5/1978 | Germany . |
| 144281 | 8/1980 | Germany . |
| 146306 | 2/1981 | Germany . |
| 2021294 | 11/1979 | United Kingdom . |

OTHER PUBLICATIONS

Patent Abstracts of Japan 60–70174 A., C–298, Aug. 10, 1985, vol. 9, No. 200.
62–182273 A, C–472, Jan. 30, 1988, vol. 12, No. 33.
Applied Physics A. Solids and Surfaces. Bd. A51, Nr. 5, Nov. 1990, Heidelberg De Seiten 423–426; Rao et al.: Preparation and Characterization of Cu–Cu20 Cermet Films, Seite 424, Spalte 2, Zeile 19—Seite 425, Spalte 1, Zeile 8.

*Primary Examiner*—Nam Nguyen
*Attorney, Agent, or Firm*—Felfe & Lynch

[57] ABSTRACT

A method is proposed for controlling a reactive sputtering process wherein the working point on the physical characteristic curves, cathode voltage or working current intensity over reactive gas flow to the sputtering apparatus, defined by the value of one of the two factors determining the electrical power drain of the reactive sputtering process, is adjusted and maintained constant by metering the reactive gas, for example $O_2$, to the process chamber. Further, the invention proposes a device for the practice of the method, wherein a sputtering apparatus is provided, comprising a controller 5 (reactive gas controller) and a control valve 8 for metering the reactive gas. Further, a signal line 15 is provided which carries the cathode voltage to the input of the controller in which the output of the controller is connected to the control valve via a line 16 which supplies the adjusting magnitude computed in the controller to the control valve.

10 Claims, 2 Drawing Sheets

METHOD FOR CONTROLLING A REACTIVE SPUTTERING PROCESS

BACKGROUND OF THE INVENTION

This application is a continuation of U.S. Ser. No. 989,700, filed Dec. 14, 1992, now abandoned, which is a continuation of Ser. No. 692,925 filed Apr. 29, 1991, now abandoned.

The invention relates to a method of controlling a reactive sputtering process as used, for example, in coating technologies which employ cathode sputtering.

The reactive gases used include $O_2$, $N_2$, $CH_4$, $H_2S$ and the like. The coating process produces the corresponding compounds: oxides, nitrides, carbides or sulfides which are applied onto the substrate as layers. This reactive sputtering process has proven well in the field of production engineering. It has the advantage, among others, of rendering the production of chemical compounds reproducible. An example is the use of such reactive sputtering processes for the manufacture of transparent conductive layers for liquid crystal displays (LCDs).

Known are direct voltage sputtering and high frequency sputtering as well as hybrids thereof. Also known is the sputtering with a bias voltage where the substrates are placed onto an electrically insulated substrate carrier which, as opposed to the cathode, has a small negative bias voltage.

Direct voltage sputtering is limited to the cathodes (targets) made of an electrically conductive material since the insulator of a non-conductive cathode interrupts the current.

High frequency sputtering is used for the sputtering of insulators. Here, the high frequency source serves to supply power to the electrodes of the sputtering system.

In the practice, the types of high performance sputtering systems used in corresponding processes are those where a magnetic field in front of the cathode enhances the probability of particles to collide and thus become ionized.

A high performance sputtering device of this kind is described, for example in German patent 24 17 288.

This publication shows a cathode sputtering apparatus with a high sputtering rate which comprises a cathode the surface of which holds the material to be sputtered and deposited on a substrate. Further, it has a magnet which is adjusted such that the magnetic flux lines emanating from the sputtering surface and returning thereto form a discharge zone which has the form of a closed loop. It also includes an anode disposed outside the paths of the sputtered material traveling from the sputtered surface toward the substrate.

This patent proposes that the cathode surface to be sputtered and facing the substrate to be coated be planar, that the substrate, in the vicinity of the discharge zone, can be moved above the planar sputtering surface and parallel thereto, and that the magnet system generating the magnetic field be disposed on the side of the cathode which faces away from the planar sputtering surface.

SUMMARY OF THE INVENTION

The actualization of the principle on which the present invention is based is not restricted to cathode sputtering as described above. The subject matter of the invention is universally usable wherever the regulation of reactive sputtering processes is important.

The present invention addresses itself to the following tasks:

The control of the reactive sputtering process is to be basically improved. More particularly, it is the purpose of the invention to ensure a more stable sputtering operation, i.e. operation must remain stable at or in the proximity of a working point on the physical characteristic curve.

The sputtering should be free of arcing. Further, a high sputtering rate should be maintained during the sputtering process.

Finally, the subject matter of the invention is to be universally usable, namely in the above-described direct-current sputtering process is (DC sputtering), in high-frequency sputtering (HF sputtering), in combined DC/HF sputtering, in sputtering at medium frequencies (in the kilohertz range) and in sputtering with or without bias.

The stated tasks are accomplished in accordance with the invention by adjusting and keeping constant or approximately constant the working point on the physical characteristic curve of cathode voltage or working current over the flow of reactive gas to the sputtering apparatus, as defined by the value of one of the two factors determining the electrical power drain of the reactive sputtering process, by metering the flow of the reactive gas, oxygen for example, fed into the processing chamber. The total sputtering power, $P=IV$, is kept constant by the power supply system.

In detail, the invention proposes that the working point of the sputtering system, as defined by the value of the operating voltage (discharge voltage), be adjusted and maintained constant or approximately constant by metering the supply of reactive gas, for example $O_2$, to the process chamber.

Alternatively, provision can be made such that the working point of the sputtering system, as defined by the value of the working current, is selected and maintained constant or approximately constant by metering the supply of reactive gas, for example $O_2$, to the process chamber.

Additionally, it is proposed that when reactive sputtering processes are employed wherein the sputtered layers comprise chemical compounds, such as $Al_2O_3$, $SiO_2$ for example, which have a secondary electron yield that is higher than that of the metallic components, e.g. Al, Si, of the chemical compounds, a regulating characteristic is applied in the metering of the reactive gas, which is characterized by a descending characteristic curve for the discharge voltage/reactive gas flow, i.e. a diminishing discharge voltage with an increasing reactive gas flow is established in the characteristic curve.

In the latter embodiment, it is alternatively possible that when reactive sputtering processes are employed wherein the sputtered layers comprise chemical compounds, $Al_2O_3$, $SiO_2$ for example, which have a secondary electron yield that is higher than that of the metallic components, e.g. Al, Si, of the chemical compounds, the metered addition of the reactive gas is regulated by a control characteristic distinguished by an ascending discharge current/reactive gas flow curve, i.e. an ascending discharge current with increasing reactive gas flow is established as the characteristic.

It is further part of the subject matter of the invention that when reactive sputtering processes are employed wherein the sputtered-on layers comprise chemical compounds, CrO, for example, which have a secondary electron yield that is lower than that of the metallic components, e.g. Cr, of the chemical compounds, the metered addition of the reactive gas is regulated by a control characteristic distinguished by an ascending discharge voltage/reactive gas flow curve, i.e. an ascending discharge voltage with increasing reactive gas flow is established as the characteristic curve.

Alternatively, it is possible that when reactive sputtering processes are employed wherein the sputtered layers comprise such chemical compounds as CrO, for example, which have a secondary electron yield that is lower than that of the metallic compounds, e.g. Cr, of the chemical compounds, the metered addition of the reactive gas is regulated by a control characteristic distinguished by a descending discharge current/reactive gas flow curve, i.e. a descending discharge current with an increasing reactive gas flow is established as the characteristic.

In detail, provision is made such that the cathode voltage is supplied to a control as a found value or an input signal, and that the control processes the input signal into an output signal which is fed as an adjusting magnitude to an actuator in the form of a control valve for the supply of reactive gas, this valve metering the supply of reactive gas.

Alternatively, it is proposed that the current level be supplied to a control as a found value or an input signal, and that the control process the input signal into an output signal which, as a is fed as an adjusting magnitude to an actuator in the form of a control valve for the supply of reactive gas, this valve metering the supply of reactive gas.

The invention further comprises an apparatus for the practice of the above method.

In particular, the invention proposes that a sputtering apparatus be provided comprising a control system (reactive gas control) and a control valve for the metering of the reactive gas, that a signal line be provided supplying the cathode voltage to the input of the control, and that the output of the control system be connected to the control valve via a line which supplies the adjusting magnitude obtained in the control to the control valve.

Alternatively, in another embodiment, it is possible to employ the cathode current instead of the cathode voltage.

The invention accomplishes the following advantages:

The sputtering is ensured at a stable working point or in the proximity thereof. Sputtering is free of arcing. A high sputtering rate is maintained during the sputtering process.

Additional details of the invention, the object, and the advantages gained can be understood from the following description of an embodiment of an apparatus for the practice of the method in accordance with the invention.

BRIEF DESCRIPTION OF THE DRAWING

The embodiment and the physical characteristic curves of a reactive sputtering process as well as the control procedures employed are explained with reference to three figures.

DETAILED DESCRIPTION OF THE PREFERRED EMBODIMENTS

The apparatus serves to produce layers on a non-represented substrate by means of reactive sputtering. In the present case, these layers consist of chemical compounds, for example $Al_2O_3$ or $SiO_2$. A metallic target made of Al or Si is used for the sputtering. The sputtering atmosphere consists of a gas mixture comprising Ar and, as a reactive gas, $O_2$.

The apparatus comprises a control system in which a certain control characteristic is installed. This control system, with the aid of the control characteristic, processes the cathode voltage as an input signal to form a regulating magnitude available at the output of the control system. This regulating signal is supplied to an adjusting means in the form of a control valve for the reactive gas $O_2$.

On the basis of the installed control characteristic the flow of $O_2$ is regulated in such a manner that the established discharge voltage (working voltage) remains constant.

In those sputtering processes where the substrates are coated with chemical compounds, e.g. $Al_2O_3$, $SiO_2$, which have a secondary electron yield that is higher than that of the metallic components, e.g. Al, Si, a control characteristic is applied in the metering of the reactive gas which is a descending characteristic curve for the discharge voltage/reactive gas flow, i.e. the characteristic curve is established as a descending discharge voltage with an increasing reactive gas flow.

The inventive achievement consists in the fact that a principle of control has been found, whose teaching is contrary to what is indicated by the physical characteristics, "cathode voltage over oxygen flow" (see FIG. 2) and "current over oxygen flow" (see FIG. 3), and which nevertheless works in practice, whereas a control along the physical characteristics leads to the "abortion" of the sputtering process.

The core of the invention teaches that the desired stable working point of the sputtering process is controlled through the metered addition of the reaction gas.

Figure 1:
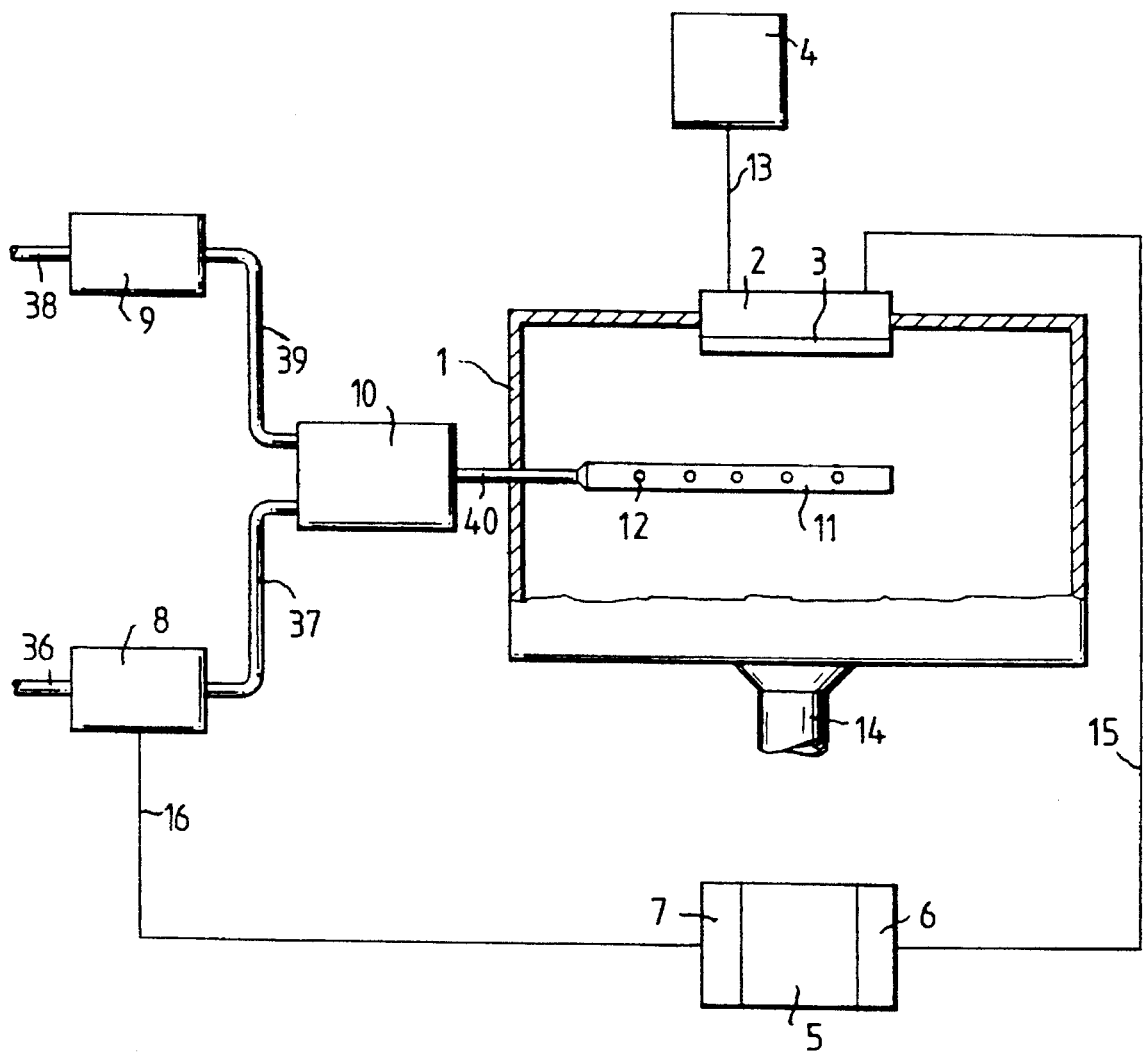
FIG. 1 is a diagrammatic representation of the apparatus.
Figure 2:
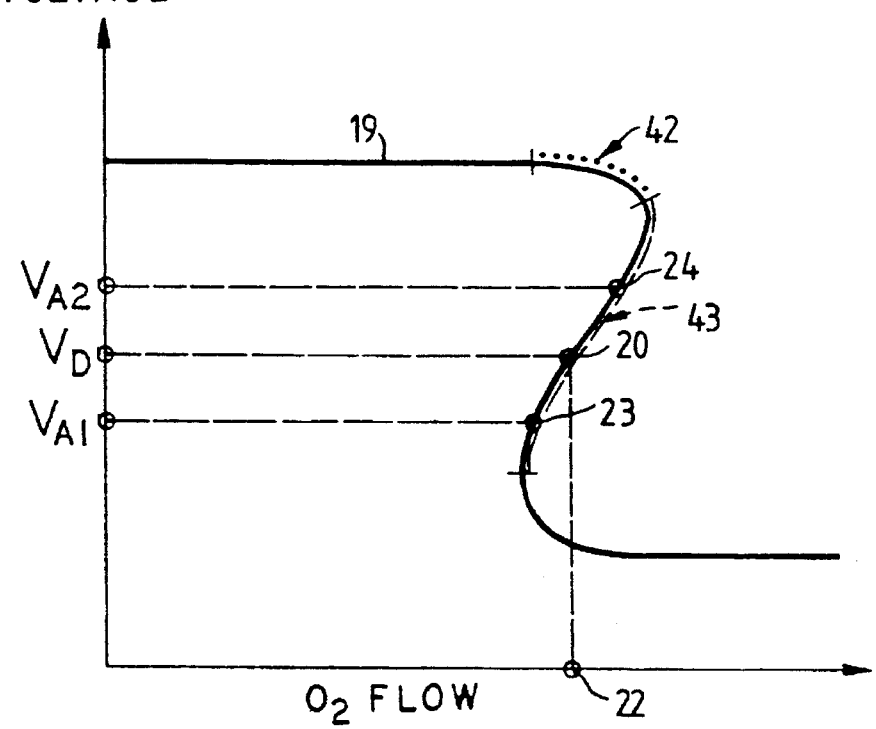
FIG. 2 shows the discharge voltage in relation to the $O_2$—flow in the form of a curve.
Figure 3:
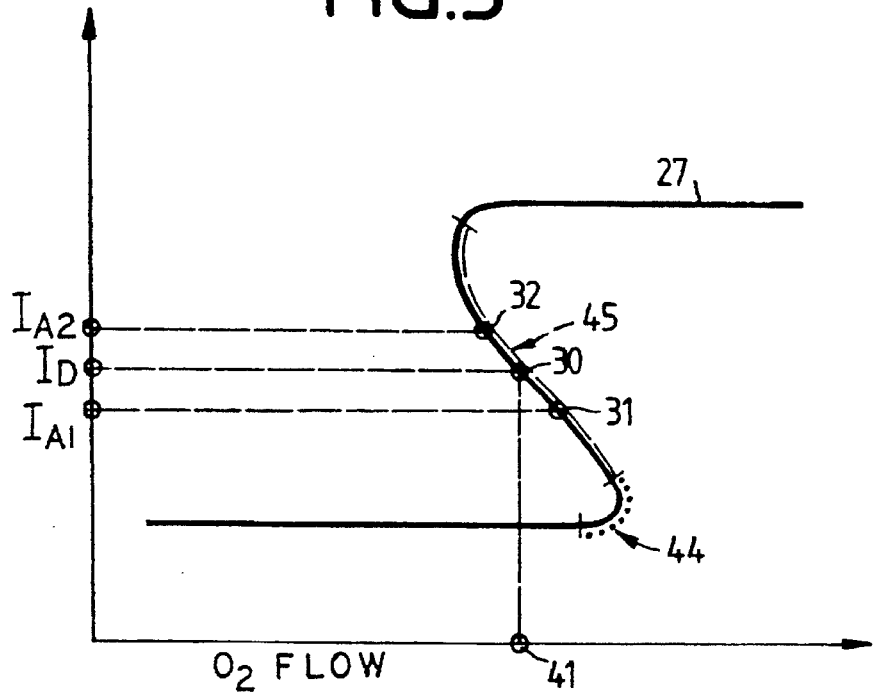
FIG. 3 shows the discharge current in relation to the $O_2$—flow in the form of a curve.

FIGS. 2 and 3 are discussed further below. First the design of the sputtering apparatus will be described with reference to FIG. 1.

In FIG. 1, the process chamber is referenced as 1. Numeral 2 designates the cathode. The target bears numeral 3. Numeral 4 designates the energy supply. This can be a DC power supply or an HF transmitter (high frequency). Provision can also be made for an energy source comprising a DC power supply and an HF transmitter. Further, an MF trasnmitter (medium frequency) can also be provided.

Numeral 5 refers to a control system having an input 6 in which the control characteristic is installed as the guiding magnitude for output 7.

Numeral 8 designates an actuator of the control circuit in the form of a control valve. 9 references a flow meter for argon. 10 is the reference numeral for the gas mixer. Inside the process chamber 1, there is a lance 11 having outlets 12 for the gas mixture consisting of $O_2$ and Ar. Depending on the application requirements, the outlet openings are arranged in a gas shower or lance or in any other suitable arrangement. Vacuum line 14 serves to bring the process chamber to the necessary low operating pressure.

Numeral 36 references the supply line for the reactive gas $O_2$. 37 is a line carrying the $O_2$—flow, controlled by the control system, to the gas mixture.

Numeral 38 designates the argon supply line. 39 is the connecting line between flow meter 9 and gas mixer 10. 40 is the connecting line between gas mixer and gas shower or lance 11.

The substrate and the layer growing thereon, e.g. $Al_2O_3$, are omitted for reasons of simplicity since they are generally known.

During the sputtering process, an Ar/$O_2$—atmosphere, hence a reactive atmosphere, prevails in the process chamber.

The power supply unit 4 feeds, among other things, the electric power P, which is the product of voltage V and current I and is necessary for the sputtering process, via line 13 to cathode 2. Further power lines which may be necessary are omitted for simplicity's sake and to keep the drawing clear. During the sputtering process, there is a plasma inside the process chamber; cf. in this respect numerous prior art publications.

Line 15 serves to supply the cathode voltage to input 6 of control 5 (reactive gas control). On the basis of the guiding magnitude (control characteristic) installed in the control, the signal available at input 6 is processed into a regulating magnitude which is made available at output 7 of the control. Line 16 serves to supply this regulating magnitude to the actuator (control valve) for the $O_2$—flow. The flow of $O_2$ is hence metered according to the installed control characteristic.

The following explanations are provided for a general understanding the procedures and the sputtering process described below.

Oxides, for example $Al_2O_3$ or $SiO_2$, will form during the sputtering. Instead of $Al_2O_3$ or $SiO_2$ other oxides or chemical compounds may be formed. On the one hand, the oxides form the coating growing on the substrate and, on the other hand, they blanket the target surface over a more or less large area during the sputtering process. The formation of this coating or blanket begins on the non-eroded areas of the target surface and grows, depending on the parameters, more or less into the eroded areas of the target surface.

It is assumed hereinafter that the chemical compound of the growing coating is $Al_2O_3$ and the reactive gas used is $O_2$.

Depending on the extent to which the target surface is covered with oxide, there will be a more or less high yield of secondary electrons. An increased supply of $O_2$, will produce a larger covering of the target with $Al_2O_3$. The greater the blanketing of the target, the greater will be the yield of secondary electrons. A higher yield of secondary electrons means a greater discharge current I. If the power is kept constant, this is equivalent to a diminishing discharge voltage V since $P_{const}=IV$.

Further details on the physical and chemical bases of the processes described here can be understood from technical literature.

The paradox, i.e., the contrast between the physical characteristic curves, on the one hand, and the installed control characteristics, on the other will be explained below with the aid of FIGS. 2 and 3. As mentioned earlier, the inventive step lies in defining these control characteristics contrary to the teaching of the physical characteristic curves.

FIG. 2 shows the physical characteristic curve 19 for "cathode voltage over $O_2$ flow." Numeral 20 is the working point, the desired point of control, on the curve, corresponding to desired voltage $V_D$ $U_{desired}$, and 22 is the corresponding $O_2$ flow. Numeral 23 is a an actual point which is below the desired point. Numeral 24 designates a second actual point which is above the desired point. The two actual voltages $V_{A1}$ and $V_{A2}$ are associated with these two actual points. Although according to the physical characteristic curve for the discharge voltage/reactive gas flow in FIG. 2, there are slopes of opposite signs in the portions 42, distinguished by a dotted parallel accompanying line, and 43, identified by a broken parallel accompanying line, both relevant to the sputtering, only one control characteristic is used to regulate the process in both portions, namely the working portion 43 of the curve, where the working point of interest is located. Contrary to the physical characteristic it is necessary to regulate according to a control characteristic having a slope of opposite sign (an apparent contradiction to the rule). Since the voltage ultimately decreases with increasing $O_2$ flow, the overall slope of the curve is negative, whereas the slope of the working portion 43 is positive.

The following is a description of the control behavior for V smaller than $V_D$:

1. The control compares V to $V_D$ and determines when $V_{A1}$ has been reached.
2. In contradiction to what the physical characteristic curve, dictates the controller reduces the flow of $O_2$. This results in the following:
   a. the oxide layer on the target surface is reduced,
   b. the yield of secondary electrons thus decreases, i.e. the current I is reduced,
   since $P_{constant}=IV$, the discharge voltage hence increases and, exceeding $V_D$, reaches the value $V_{A2}$.
3. The determines that $V_{A2}$ has been reached.
4. The controller increases the flow of $O_2$.
5. The oxide blanket on the target surface grows.
6. The yield of secondary electrons increases and so does the current strength.
7. Since $P_{constant}=IV$, the voltage decreases and approaches and/or reaches the value $V_D$.

Conclusion: Controlling the flow of $O_2$ adjusts working point 20 and $V_D$.

The physical characteristic curve "Current strength I with respect to $O_2$—flow" is in FIG. 3 represented as curve 27.

The desired operating current $I_D$ and the value 41 for the flow of $O_2$ are associated with the working point 30. The actual point 31 is associated with the actual current $I_{A1}$ and actual point 32 with actual current $I_{A2}$. The physical characteristic curve for the discharge current/reactive gas flow in FIG. 3 shows that characteristic portion 44 indicated by a parallel dotted secondary line and characteristic portion 45 indicated by a parallel broken secondary line have slopes of opposite signs. Yet the control of the sputtering process in both portions involves only one control characteristic for the control of the sputtering process, namely that of the working portion 45 of the curve where the relevant working point is located. The control, in contrast to the physical characteristic curve, must follow a control characteristic having a slope of opposite sign (seemingly a contradiction of the rule). Since the current ultimately increases with increasing $O_2$ flow, the overall slope of the curve is positive, whereas the slope of the working portion 45 is negative.

The following is a description of how the control works if I is less than $I_D$.

1. The controller compares I to $I_D$ and determines when $I_{A1}$, has been reached.
2. Contrary to dictates the physical characteristic curve, dictates the controller increases the flow of $O_2$ which leads to the following:
   a. the oxide blanket on the target surface continues to grow,
   b. the yield of secondary electrons hence increases, i.e. the current I increases,
   c. this leads to an increase of the discharge current since $P_{const}=IV$ and, exceeding $I_{A2}$, has been reached $L_{-2}$, reference numeral 35.
3. The controller $I_{A2}$ to $I_{desired}$ and determines that $I_{A2}$ has been reached.
4. The controller reduces the flow of $O_2$.
5. The oxide blanket on the target surface is further reduced.
6. The yield of secondary electrons is further reduced and the current strength hence decreases.

7. The actual current approaches the desired the current strength and eventually reaches the desired current.

Conclusion: Controlling the flow of $O_2$ adjusts working point 30 and $I_{desired}$.

When sputtering layers which are made of chemical compounds, e.g. CrO where the yield of secondary electrons is smaller than the secondary electron yield of the corresponding metallic components, e.g. Cr, the present invention proposes characteristic parameters for cathode voltage/reactive gas flow and cathode current/reactive gas flow which, due to their reversed yield of secondary electrons, have a correspondingly reversed configuration. This reversion refers to the control characteristics and control processes described further above in connection with FIGS. 2 and 3. Additional details of this control process are disclosed in the above claims 7 and 8 and in the introductory part of the description.

Parts List 1 process chamber
2 cathode
3 target
4 energy supply
5 controller
6 input
7 output
8 control valve
9 flowmeter
10 gas mixer
11 apparatus
12 opening
13 line
14 vacuum line
15 line
16 line
17 ordinate
18 abscissa
19 curve
20 working point
21 voltage
22 $O_2$—flow, value
23 actual point
24 actual point
25 actual voltage, $U_{act-1}$
26 actual voltage, $U_{act-2}$
27 curve
28 ordinate
29 abscissa
30 working point
31 actual point
32 actual point
33 operating current
34 actual current, $I_{act-1}$
35 actual current, $I_{act-2}$
36 line
37 line
38 line
39 line
40 line
41 $O_2$—flow, value
42 portion of characteristic curve
43 portion of characteristic curve
44 portion of characteristic curve
45 portion of characteristic curve

I claim:

1. Method for controlling a reactive sputtering process comprising providing a cathode bearing a target to be sputtered in an evacuable chamber, supplying reactive gas to said chamber for reactive sputtering said target to produce a layer comprising a chemical compound having a metallic component, said layer emitting secondary electrons during sputtering, reactively sputtering said target by connecting said cathode to a power supply for producing a cathode discharge voltage V and a cathode discharge current I, keeping power P=IV constant, thereby providing a physical characteristic curve of discharge voltage versus reactive gas flow having an overall slope and a working portion on which a desired working voltage is located, said working portion having a slope of opposite sign than said overall slope, decreasing the reactive gas flow when said physical characteristic curve dictates increasing said reactive gas flow to achieve said desired working voltage, and increasing the reactive gas flow when said physical characteristic curve dictates decreasing said reactive gas flow to achieve said desired working voltage.

2. Method as in claim 1 wherein said chemical compound has a yield of secondary electrons during sputtering that is higher than that of said metallic component, whereby said physical characteristic curve has an overall slope which is negative and a working portion with a slope which is positive.

3. Method as in claim 2 wherein said chemical compound is one of $Al_2O_3$ and $SiO_2$.

4. Method as in claim 1 wherein said chemical compound has a yield of secondary electrons during sputtering that is lower than that of said metallic component, whereby said physical characteristic curve has an overall slope which is positive and a working portion with a slope which is negative.

5. Method as in claim 4 wherein said chemical compound is CrO.

6. Method for controlling a reactive sputtering process comprising providing a cathode bearing a target to be sputtered, supplying reactive gas to said chamber for reactive sputtering said target to produce a layer comprising a chemical compound having a metallic component, said layer emitting secondary electrons during sputtering, reactively sputtering said target by connecting said cathode to a power supply for producing a cathode discharge voltage V and a cathode discharge current I, keeping power P=IV constant, thereby producing a physical characteristic curve of discharge current versus reactive gas flow having an overall slope and a working portion on which a desired working current is located, said working portion having a slope of opposite sign than said overall slope, increasing the reactive gas flow when said physical characteristic curve dictates decreasing said reactive gas flow to achieve said desired working current, and decreasing the reactive gas flow when said physical characteristic curve dictates increasing said reactive gas flow to achieve said desire working current.

7. Method as in claim 6 wherein said chemical compound has a yield of secondary electrons during sputtering that is higher than that of said metallic component, whereby said physical characteristic curve has an overall slope which is positive and a working portion with a slope which is negative.

8. Method as in claim 7 wherein said chemical compound is one of $Al_2O_3$ and $SiO_2$.

9. Method as in claim 6 wherein said chemical compound has a yield of secondary electrons during sputtering that is lower than said metallic component, whereby said physical characteristic curve has an overall slope which is negative and a working portion with a slope which is positive.

10. Method as in claim 9 wherein said chemical compound is CrO.

* * * * *

UNITED STATES PATENT AND TRADEMARK OFFICE
CERTIFICATE OF CORRECTION

PATENT NO. : 5,556,520
DATED : September 17, 1996
INVENTOR(S) : Rudolf LATZ

It is certified that error appears in the above-indentified patent and that said Letters Patent is hereby corrected as shown below:

In column 2, line 11, change "process is" to --processes--.

In column 3, lines 48-51, delete the paragraph beginning "The embodiment . . ." and ending ". . . to three figures."

In column 5, line 54, delete "$U_{desired}$".

In column 6, lines 10-11, after "curve" delete -- , --; after "dictates" insert -- , --.

In column 6, line 18, before "determines" add --controller--.

In column 6, lines 37-38, after "process" delete --in both portions--.

In column 6, line 49, after "$I_{A1}$" delete -- , --.

In column 6, line 51, change "dictates" to --what--; after "curve" delete -- , --.

UNITED STATES PATENT AND TRADEMARK OFFICE
CERTIFICATE OF CORRECTION

PATENT NO. : 5,556,520
DATED : September 17, 1996
INVENTOR(S) : Rudolf LATZ

It is certified that error appears in the above-indentified patent and that said Letters Patent is hereby corrected as shown below:

In column 6, line 52, after "dictates" add -- , --.

In column 6, lines 60-61, delete "$I_{A2}$, has been reached $I_{-2}$, reference numeral 35." and replace with --$I_D$, it reaches the value of $I_{A2}$--.

In column 6, line 62, delete "$I_{A2}$ to $I_{desired}$ and".

Signed and Sealed this

Twenty-eighth Day of September, 1999

Attest:

Q. TODD DICKINSON

*Attesting Officer*     *Acting Commissioner of Patents and Trademarks*